(12) United States Patent
Wang et al.

(10) Patent No.: US 11,277,154 B2
(45) Date of Patent: Mar. 15, 2022

(54) POLAR CODE-BASED INTERLEAVING METHOD AND COMMUNICATION APPARATUS

(71) Applicant: Huawei Technologies Co., Ltd., Shenzhen (CN)

(72) Inventors: Guijie Wang, Hangzhou (CN); Rong Li, Hangzhou (CN); Jun Wang, Hangzhou (CN); Gongzheng Zhang, Hangzhou (CN); Huazi Zhang, Hangzhou (CN)

(73) Assignee: Huawei Technologies Co., Ltd., Shenzhen (CN)

(*) Notice: Subject to any disclaimer, the term of this patent is extended or adjusted under 35 U.S.C. 154(b) by 69 days.

(21) Appl. No.: 16/704,859

(22) Filed: Dec. 5, 2019

(65) Prior Publication Data

US 2020/0153459 A1 May 14, 2020

Related U.S. Application Data (63) Continuation of application No. PCT/CN2018/090880, filed on Jun. 12, 2018.

(30) Foreign Application Priority Data

Jun. 16, 2017 (CN) .......................... 201710457819.4

(51) Int. Cl.
*H03M 13/00* (2006.01)
*H03M 13/27* (2006.01)
*H03M 13/13* (2006.01)

(52) U.S. Cl.
CPC ....... *H03M 13/2792* (2013.01); *H03M 13/13* (2013.01)

(58) Field of Classification Search
CPC .......................... H03M 13/2792; H03M 13/13
See application file for complete search history.

(56) References Cited

U.S. PATENT DOCUMENTS

| 6,151,690 A | 11/2000 | Peeters |
| 7,503,046 B2* | 3/2009 | Beaumont ............. G06F 9/5066 712/11 |

(Continued)

FOREIGN PATENT DOCUMENTS

| CN | 1399429 A | 2/2003 |
| CN | 101034951 A | 9/2007 |

(Continued)

OTHER PUBLICATIONS

D'Azzo et al., "Analysis and Design of Linear Control System Based on MATLAB," Mechanical Industry Press (2008). With English Abstract.

(Continued)

*Primary Examiner* — Esaw T Abraham
(74) *Attorney, Agent, or Firm* — Leydig, Voit & Mayer, Ltd.

(57) ABSTRACT

A polar code-based interleaving method and apparatus, to resolve a problem existing in the prior art that when a code length is relatively long, an implementation process of reading a sequence obtained after random interleaving is relatively complex, is provided. The method includes: determining an interleaving matrix based on a target code length M of a polar code; and interleaving, based on the interleaving matrix, encoded bits obtained after encoding of the polar code, to generate interleaved bits.

20 Claims, 10 Drawing Sheets

(56) References Cited

U.S. PATENT DOCUMENTS

| | | | | |
|---|---|---|---|---|
| 8,638,244 | B2* | 1/2014 | Neeman | H03M 13/2957 |
| | | | | 341/81 |
| 9,742,440 | B2* | 8/2017 | El-Khamy | H03M 13/6368 |
| 10,171,204 | B2* | 1/2019 | Wu | H04L 1/1819 |
| 10,312,946 | B2* | 6/2019 | Wang | H03M 13/3753 |
| 10,461,779 | B2* | 10/2019 | Hong | H04L 1/0067 |
| 10,728,080 | B2* | 7/2020 | Sankar | H03M 13/356 |
| 2014/0208183 | A1 | 7/2014 | Mahdavifar et al. | |
| 2014/0321575 | A1* | 10/2014 | Asakura | H04B 7/0848 |
| | | | | 375/296 |
| 2017/0012739 | A1 | 1/2017 | Shen et al. | |
| 2017/0012740 | A1 | 1/2017 | Shen et al. | |
| 2019/0268025 | A1 | 8/2019 | Shen et al. | |

FOREIGN PATENT DOCUMENTS

| | | |
|---|---|---|
| CN | 101075857 A | 11/2007 |
| CN | 101399554 A | 4/2009 |
| CN | 101540654 A | 9/2009 |
| CN | 102142928 A | 8/2011 |
| CN | 104219019 A | 12/2014 |
| WO | 2015139297 A1 | 9/2015 |
| WO | 2015143593 A1 | 10/2015 |

OTHER PUBLICATIONS

Gou et al., "The Common Interleaving Technology in Turbo Codes," with an English abstract, total 3 pages, (Mar. 2003).

"Interleaver design for Polar codes," 3GPP TSG-RAN WG1 Meeting #89, Hangzhou, China, R1-1708649, XP051273836, total 5 pages, 3rd Generation Partnership Project, Valbonne, France (May 15-19, 2017).

Jin et al., "Performance of polar coding for the power line communications in the presence of impulsive noise," IET Communications, vol. 9, No. 17, pp. 2101-2106, (Jul. 17, 2015).

"Identity matrix," Wikipedia, XP055677295, total 2 pages, (Mar. 17, 2020).

* cited by examiner

| x1 | x5 | x3 | x7 | x4 | x6 | x2 | x8 |
|---|---|---|---|---|---|---|---|
| x9 | x11 | x10 | x12 | 0 | 0 | 0 | 0 |
| x13 | x15 | 0 | 0 | 0 | x16 | x14 | 0 |
| x17 | x18 | 0 | 0 | 0 | 0 | 0 | 0 |
| x19 | 0 | x21 | 0 | x22 | 0 | x20 | 0 |
| x23 | 0 | x24 | 0 | 0 | 0 | 0 | 0 |
| x25 | 0 | 0 | 0 | 0 | 0 | x26 | 0 |
| x27 | 0 | 0 | 0 | 0 | 0 | 0 | 0 |

FIG. 11

| x1  | x2  | x3  | x4  | x5  | x6  | x7  | x8 |
|-----|-----|-----|-----|-----|-----|-----|----|
| x19 | x20 | x21 | x22 | 0   | 0   | 0   | 0  |
| x13 | x14 | 0   | 0   | x15 | x16 | 0   | 0  |
| x25 | x26 | 0   | 0   | 0   | 0   | 0   | 0  |
| x9  | 0   | x10 | 0   | x11 | 0   | x12 | 0  |
| x23 | 0   | x24 | 0   | 0   | 0   | 0   | 0  |
| x17 | 0   | 0   | 0   | x18 | 0   | 0   | 0  |
| x27 | 0   | 0   | 0   | 0   | 0   | 0   | 0  |

| | | | | | | | | | | | | | | | | | | | | | | | | |
|---|---|---|---|---|---|---|---|---|---|---|---|---|---|---|---|---|---|---|---|---|---|---|---|---|
| K+27bit CRC | 47 | 47 | 47 | 67 | 67 | 67 | 127 | 127 | 127 | 227 | 227 | 227 | 427 | 427 | 427 | 627 | 627 | 627 | 827 | 827 | 827 | 1027 | 1027 | 1027 |
| Code rate R | 1/3 | 1/6 | 1/12 | 1/3 | 1/6 | 1/12 | 1/3 | 1/6 | 1/12 | 1/3 | 1/6 | 1/12 | 1/3 | 1/6 | 1/12 | 1/3 | 1/6 | 1/12 | 1/3 | 1/6 | 1/12 | 1/3 | 1/6 | 1/12 |
| M | 141 | 282 | 564 | 201 | 402 | 804 | 381 | 762 | 1524 | 681 | 1362 | 2724 | 1281 | 2562 | 5124 | 1881 | 3762 | 7524 | 2481 | 4962 | 9924 | 3081 | 6162 | 12324 |
| Minimum dimension of an interleaving matrix | 26 | 40 | 60 | 31 | 48 | 76 | 48 | 71 | 113 | 64 | 107 | 166 | 103 | 158 | 239 | 124 | 202 | 312 | 154 | 236 | 375 | 181 | 254 | 430 |
| Quantity of 1 in the interleaving matrix | 147 | 297 | 585 | 211 | 405 | 819 | 405 | 767 | 1539 | 729 | 1363 | 2733 | 1291 | 2577 | 5137 | 1899 | 3777 | 7587 | 2481 | 4977 | 9943 | 3085 | 6177 | 12363 |

FIG. 15

POLAR CODE-BASED INTERLEAVING METHOD AND COMMUNICATION APPARATUS

CROSS-REFERENCE TO RELATED APPLICATIONS

This application is a continuation of International Application No. PCT/CN2018/090880, filed on Jun. 12, 2018, which claims priority to Chinese Patent Application No. 201710457819.4, filed on Jun. 16, 2017. The disclosures of the aforementioned applications are hereby incorporated by reference in their entireties.

TECHNICAL FIELD

This application relates to the field of wireless communication technologies, and in particular, to a polar code-based interleaving method and apparatus.

BACKGROUND

With development of a 5th generation mobile communications technology (5-Generation, 5G), a polar code (Polar Codes) put forward by Arikan based on channel polarization is selected for a channel encoding scheme, and the polar code has relatively low calculation complexity in coding and decoding.

In digital communications, channel encoding is often used to improve reliability of data transmission, and an interleaving module is added to the channel encoding, so that anti-interference performance may be further improved. Specifically, on many compound channels on which both a random error and a burst error occur, for example, channels on which shortwave scatter, tropospheric scatter, and the like occur, when an error occurs, a string of data behind is affected. Consequently a burst error is beyond an error-correcting capability of an error-correcting code, decreasing the error-correcting capability. To improve anti-interference performance of a system, a burst error is first discretized into a random error, and then the random error is corrected. In an actual application, an interleaving operation is performed on a polar code at a transmit end and a de-interleaving operation is performed at a receive end. A function of interleaving is disordering elements in an original data sequence, to weaken a correlation between data sequences before and after interleaving, and reduce impact of a data burst error, thereby improving anti-interference performance. In the prior art, a random interleaving manner is provided. According to the random interleaving manner, when an interleaved sequence is calculated offline, a permutation sequence needs to be recorded for use in interleaving and de-interleaving. When a code length is relatively long, an implementation process of reading a sequence obtained after random interleaving is relatively complex.

SUMMARY

Embodiments of this application provide a polar code-based interleaving method and apparatus, to resolve a problem existing in the prior art that when a code length is relatively long, an implementation process of reading a sequence obtained after random interleaving is relatively complex.

According to a first aspect, this application provides a polar code-based interleaving method, including: determining an interleaving matrix based on a target code length M of a polar code; and interleaving, based on the interleaving matrix, encoded bits obtained after encoding of the polar code, to generate interleaved bits.

According to the foregoing method, the encoded bits obtained after the encoding of the polar code are interleaved by using the interleaving matrix determined based on the target code length M of the polar code, so that an implementation process of reading a sequence obtained after random interleaving is simple.

In an example design, the interleaving matrix is determined based on n unit matrices, and n is determined based on the target code length M.

According to the foregoing method, an implementation method for determining the interleaving matrix is simple.

In an example design, the interleaving matrix is determined by transposing a matrix obtained after n unit matrices are processed according to a specified algorithm, and n is determined based on the target code length M.

According to the foregoing method, the interleaving matrix that is simple and different from the interleaving matrix obtained by processing the n unit matrices according to the specified algorithm is determined.

In an example design, the interleaving matrix is determined by performing double-matrix superposition on an initial interleaving matrix.

According to the foregoing method, the interleaving matrix more complex than the initial interleaving matrix is determined, thereby further improving anti-interference performance.

In an example design, the interleaving matrix is determined by performing column bit order reversing or row bit order reversing on an initial interleaving matrix.

According to the foregoing method, the interleaving matrix more complex than the initial interleaving matrix is determined, thereby further improving anti-interference performance.

In an example design, the initial interleaving matrix is determined based on n unit matrices, or the initial interleaving matrix is determined by transposing a matrix obtained after n unit matrices are processed according to a specified algorithm, and n is determined based on the target code length M.

In an example design, that a dimension of the interleaving matrix is determined according to a formula $M \geq 3^{log_2(N)}$ includes:

determining a maximum value of N that satisfies $M \geq 3^{log_2(N)}$ as a dimension P1; determining a version value of $3^{log_2(N)}$ when N=P1, and determining a value of a remainder $M - 3^{log_2(N)}$; rounding a value obtained after dividing the remainder by 2 to an integer, using the integer as a new M, and determining a new maximum value of N that satisfies $M \geq 3^{log_2(N)}$ as a dimension P2; determining at least one new dimension Pi in sequence based on the foregoing two steps, and stopping calculation of Pi until the remainder is 1, 2, or 3, where a dimension Pi=Pn before the remainder is 1, 2 or 3; and determining a sum value of P1, P2, . . . , and Pn, where when the remainder is 1, the dimension of the interleaving matrix is equal to the sum value plus 1; or when the remainder is 2 or 3, 2 is added to the sum value, or the sum value is adjusted to a prime number neighboring to the sum value, where the prime number is greater than the sum value.

In an example design, when the unit matrix is $$F = \begin{bmatrix} 1 & 0 \\ 1 & 1 \end{bmatrix},$$

n is equal to $\log_2(N)$, and a dimension of the interleaving matrix that corresponds to M is determined in a pre-stored table of mapping between M and a dimension of the interleaving matrix.

According to a second aspect, this application provides an interleaving apparatus, and the interleaving apparatus has a function of implementing behavior of an interleaving apparatus in the example of the method according to the first aspect. The function may be implemented by using hardware, or may be implemented by hardware executing corresponding software. The hardware or software includes one or more modules corresponding to the foregoing function.

In an example design, a structure of the interleaving apparatus includes a determining unit and a processing unit. These units may perform corresponding functions in the example of the foregoing method. For details, refer to detailed descriptions in the example of the method. The details are not repeated herein.

According to a third aspect, this application provides a communications apparatus, including: a memory, configured to store a program; and a processor, configured to execute the program stored in the memory, where when the program is executed, the processor is configured to perform the method according to any one of the first aspect or the example designs of the first aspect.

Another aspect of this application provides a computer-readable storage medium. The computer-readable storage medium stores an instruction, and when the instruction is run on a computer, the computer is enabled to perform the method according to the foregoing aspects.

Another aspect of this application provides a computer program product including an instruction. When the instruction is run on a computer, the computer is enabled to perform the method according to the foregoing aspects.

Another aspect of this application provides a computer program, and when the computer program is run on a computer, the computer is enabled to perform the method according to the foregoing aspects.

DESCRIPTION OF EMBODIMENTS

The objectives, technical solutions, and advantages of this application are described in detail with reference to the accompanying drawings.

Embodiments of this application provide a polar code-based interleaving method and apparatus, to resolve a problem existing in the prior art that a relatively large storage space is required when a code length is relatively long. The method and the apparatus are based on a same inventive concept. Because problem-resolving principles for the method and the apparatus are similar, implementations of the apparatus and the method can be referenced to each other, and are not repeated for each implementation.

The embodiments of this application are applicable to a channel encoding and decoding process. A polar code obtained after encoding is interleaved by using an interleaving matrix of an interleaver, and when a burst error occurs, the burst error is discretized into a random error, and then the random error is corrected, so that anti-interference performance of a system is improved. In addition, compared with the prior art, an implementation process of reading a sequence obtained after random interleaving is simplified.

In the embodiments of this application, an interleaving matrix is determined based on a target code length M of a polar code; and encoded bits obtained after encoding of the polar code are interleaved based on the interleaving matrix, to generate interleaved bits. The encoded bits obtained after the encoding of the polar code are interleaved by using the interleaving matrix that is determined based on the target code length M of the polar code, so that an implementation process of reading a sequence obtained after the random interleaving is simplified.

The following specifically describes the polar code-based interleaving method provided in this application with reference to the accompanying drawings.

Figure 1:
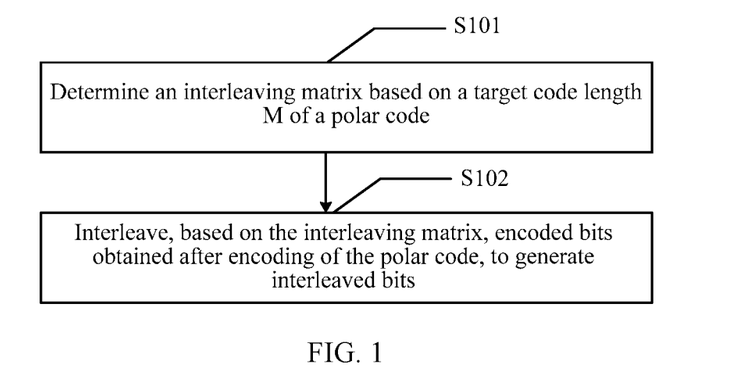
FIG. 1 is a flowchart of a polar code-based interleaving method according to an embodiment of this application.

FIG. 1 is a flowchart of a polar code-based interleaving method according to this application. The method includes the following steps.

S101. Determine an interleaving matrix based on a target code length M of a polar code.

Specifically, the interleaving matrix is determined based on n unit matrices, and n is determined based on the target code length M.

For example, when the unit matrix is $$F = \begin{bmatrix} 1 & 0 \\ 1 & 1 \end{bmatrix},$$

Figure 2:
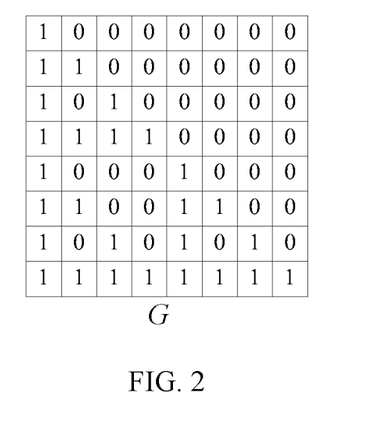
FIG. 2 is a schematic diagram of an interleaving matrix according to an embodiment of this application.
Figure 3:
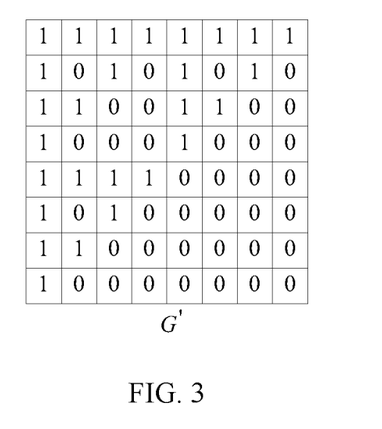
FIG. 3 is a schematic diagram of another interleaving matrix according to an embodiment of this application.
Figure 4:
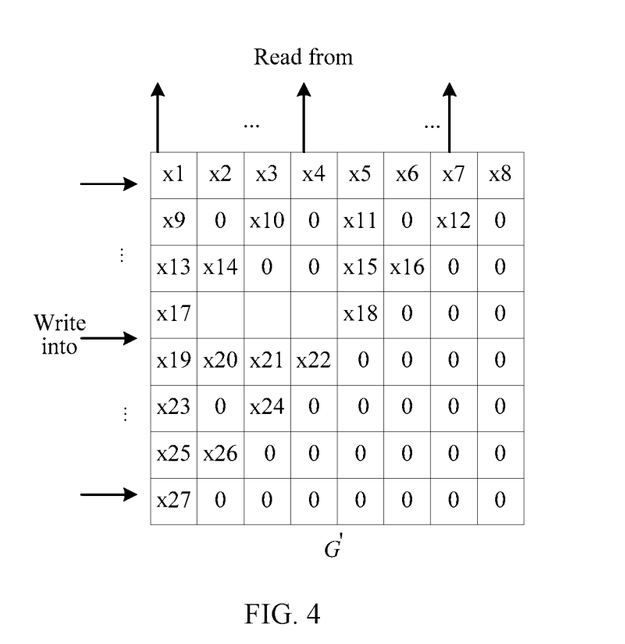
FIG. 4 is a schematic diagram of still another interleaving matrix according to an embodiment of this application.

$M=2^n$, and $M=N$, n is equal to $\log_2(N)$. In this case, then unit matrices are calculated according to a specified algorithm, and the specified algorithm may be a Kronecker product. Alternatively, the specified algorithm in this embodiment of this application may be a Tracy-Singh product, and the interleaving matrix $G_N = F^{\otimes (\log_2(N))}$ is determined by the Khatri-Rao product. As shown in FIG. 2, when n=3, the interleaving matrix is G. In the interleaving matrix G, a location of 1 is used to store data, and a location of 0 does not store data. Alternatively, the interleaving matrix $G_N=F^{\otimes(log_2(N))}$ is transposed, so that a new interleaving matrix $G_N=B_NF^{\otimes(log_2(N))}$ is determined. As shown in FIG. 3, when n=3, the interleaving matrix is G'. In the interleaving matrix G', a location of 1 is used to store data, and a location of 0 does not store data. As shown in FIG. 4, a manner of reading G' is row-in and column-out.

S102. Interleave, based on the interleaving matrix, encoded bits obtained after encoding of the polar code, to generate interleaved bits.

In an example implementation, a dimension of the interleaving matrix may further be determined by using two manners below.

Manner 1. When the unit matrix is $$F = \begin{bmatrix} 1 & 0 \\ 1 & 1 \end{bmatrix},$$

n is equal to $log_2(N)$, and the dimension of the interleaving matrix is a minimum value of N that satisfies a formula $M \geq 3^{log_2(N)}$.

Manner 2. When the unit matrix is $$F = \begin{bmatrix} 1 & 0 \\ 1 & 1 \end{bmatrix},$$

n is equal to $log_2(N)$, and a maximum value of N that satisfies $M \geq 3^{log_2(N)}$ is determined as a dimension P1; a version value of $3^{log_2(N)}$ is determined when N=P1, a value of a remainder $M-3^{log_2(N)}$ is determined; a value obtained after the remainder is divided by 2 is rounded to an integer, the integer is used as a new M, and a new maximum value of N that satisfies $M \geq 3^{log_2(N)}$ is determined as a dimension P2; at least one new dimension Pi is determined in sequence based on the foregoing two steps, and calculation of Pi is stopped until the remainder is 1, 2, or 3, where a dimension Pi=Pn before the remainder is 1, 2, or 3; and a sum value of P1, P2, ..., and Pn is determined, when the remainder is 1, the dimension of the interleaving matrix is equal to the sum value plus 1; or when the remainder is 2 or 3, 2 is added to the sum value, or the sum value is adjusted to a prime number neighboring to the sum value, where the prime number is greater than the sum value.

A specific embodiment provided based on Manner 2 is: A dimension of the interleaving matrix $G_N$ is reduced. A simple calculation example using a recursion method is as follows: When M=180, because $3^4=81<M<3^5=243$, P1=$2^4$=16, a remainder Res1=M-81=99, and [99/2]=50. Because $3^3=27<M<3^4=81$, P2=$2^3$=8, a remainder Res2=50-27=23, and [23/2]=12. Because $3^2=9<M<3^3=27$, P3=$2^2$=4, a remainder Res3=12-9=3, and a remainder is 3. Therefore, P4=2, and a dimension of the interleaving matrix $G_N$ finally required is: N=P1+P2+P3+P4=30.

Manner 3. When the unit matrix is $$F = \begin{bmatrix} 1 & 0 \\ 1 & 1 \end{bmatrix},$$

n is equal to $log_2(N)$, and a dimension of the interleaving matrix that corresponds to M is determined in a pre-stored table of mapping between M and a dimension of the interleaving matrix.

Figure 15:
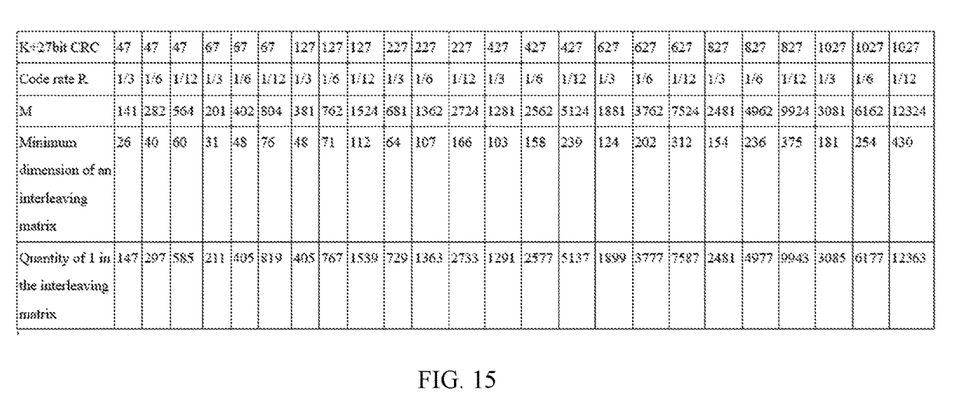
FIG. 15 illustrates a table for determining a minimum dimension of an interleaving matrix corresponding to different code lengths.

A specific embodiment provided based on Manner 3 is: In an ultra-reliable low latency communication (URLLC) scenario, a minimum dimension of an interleaving matrix corresponding to different code lengths, and a quantity of 1 in the corresponding interleaving matrix are determined based on Table 1, as shown in FIG. 15, where a minimum dimension of the interleaving matrix is a minimum value of a dimension of the interleaving matrix, and a code length in the Table 1 is a common code length in an interleaving process.

Figure 5:
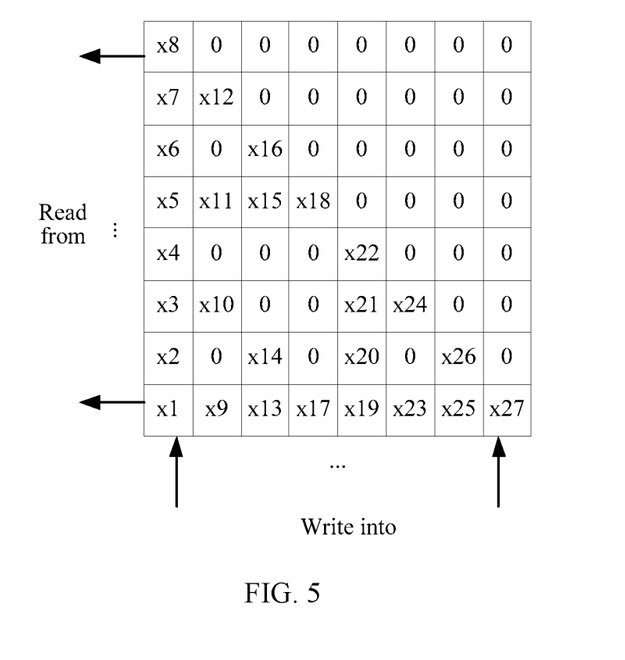
FIG. 5 is a schematic diagram of an interleaving matrix according to an embodiment of this application.
Figure 6:
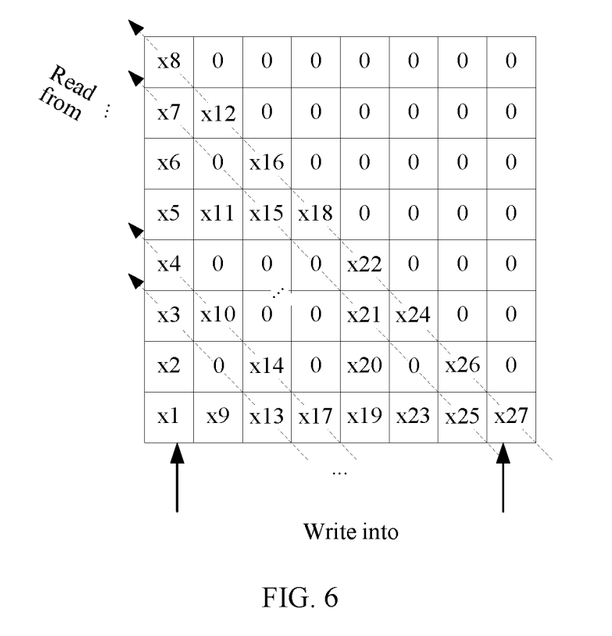
FIG. 6 is a schematic diagram of an interleaving matrix according to an embodiment of this application.

In an example implementation, an order of data writing and data reading in the interleaving matrix is not limited in the present invention. The order may be in a row-in and column-out or row-in and row-out form as described in FIG. 4, alternatively, may be in a column-in and row-out or column-in and column-out form as shown in FIG. 5, or may be in a column-in and beveled-out or row-in and beveled-out form as shown in FIG. 6. Each of FIG. 5 and FIG. 6 shows a matrix obtained after data is written to the matrix shown in FIG. 2.

In an example implementation, the interleaving matrix is determined by performing double-matrix superposition on an initial interleaving matrix.

Figure 7:
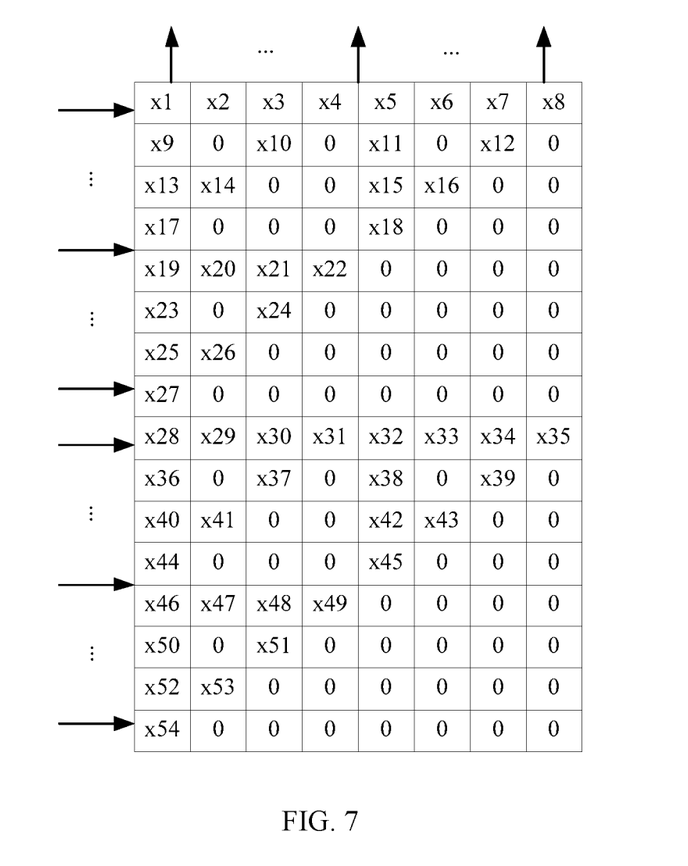
FIG. 7 is a schematic diagram of an interleaving matrix according to an embodiment of this application.

For example, when the initial interleaving matrix is shown in FIG. 3, an interleaving matrix obtained after data is written to is double-matrix superposition on an initial interleaving matrix shown in FIG. 4. As shown in FIG. 7, a manner of data writing and reading in the interleaving matrix is row-in and column-out. Alternatively, another data writing and reading manner may be used. This is not limited in this embodiment of this application.

Figure 8:
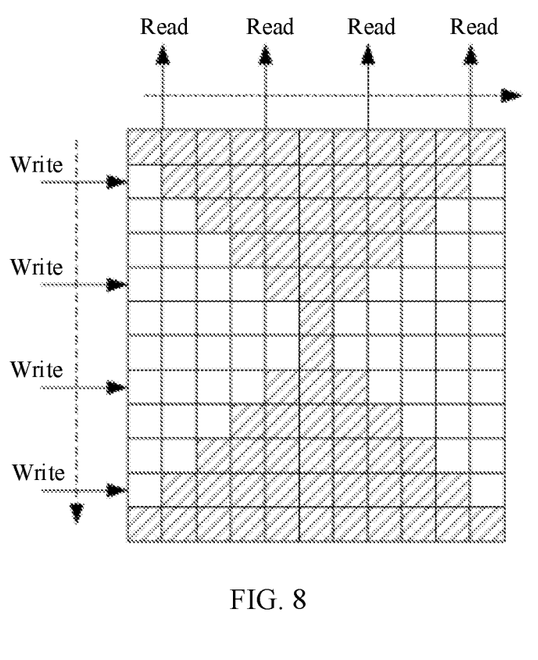
FIG. 8 is a schematic diagram of an interleaving matrix according to an embodiment of this application.
Figure 9:
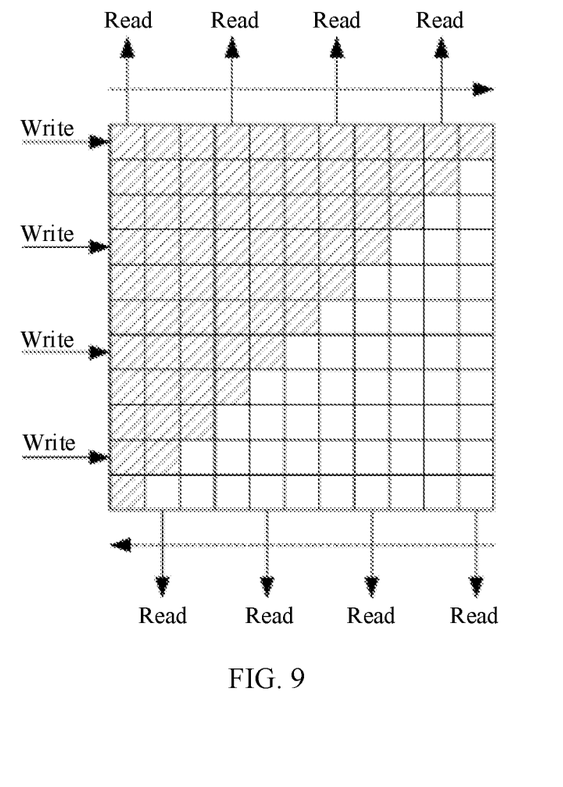
FIG. 9 is a schematic diagram of an interleaving matrix according to an embodiment of this application.
Figure 10:
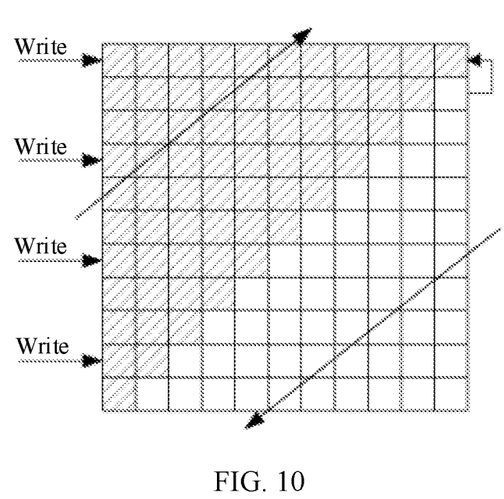
FIG. 10 is a schematic diagram of an interleaving matrix according to an embodiment of this application.

In an example implementation, a superposition manner or a reading manner of the interleaving matrix may alternatively be a manner shown in FIG. 8, FIG. 9, or FIG. 10. These examples are shown by way of illustration and not limitation.

In an example implementation, the interleaving matrix is determined by performing column bit order reversing or row bit order reversing on an initial interleaving matrix.

Figure 11:
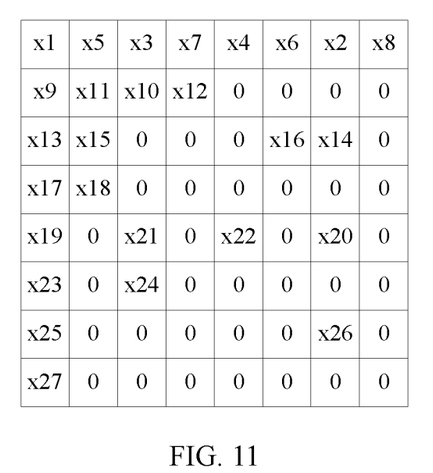
FIG. 11 is a schematic diagram of an interleaving matrix according to an embodiment of this application.
Figure 12:
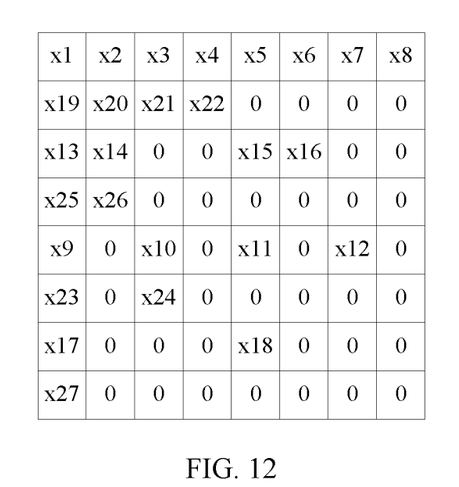
FIG. 12 is a schematic diagram of an interleaving matrix according to an embodiment of this application.

For example, when the interleaving matrix is shown in FIG. 2, a bit order reversing operation is performed on the interleaving matrix to obtain [1 5 3 7 2 6 4 8], so that an interleaving matrix that is obtained after a column bit order reversing operation is performed and that is shown in FIG. 11 is determined, and an interleaving matrix that is obtained after a row bit order reversing operation is performed and that is shown in FIG. 12 is determined.

In this embodiment of this application, the encoded bits obtained after the encoding of the polar code are interleaved by using the interleaving matrix that is determined based on the target code length M of the polar code, so that an implementation process of reading a sequence obtained after random interleaving is simple.

Figure 13:
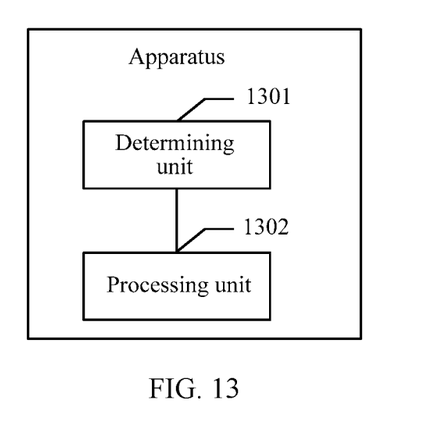
FIG. 13 is a schematic diagram of an apparatus according to an embodiment of this application.

Based on a same inventive concept of the method embodiment, this application further provides an interleaving apparatus, as shown in FIG. 13. The interleaving apparatus includes a determining unit 1301 and a processing unit 1302.

The determining unit 1301 is configured to determine an interleaving matrix based on a target code length M of a polar code.

The processing unit 1302 is configured to interleave, based on the interleaving matrix, encoded bits obtained after encoding of the polar code, to generate interleaved bits.

In an example implementation, the interleaving matrix is determined based on n unit matrices, n is determined based on the target code length M; or the interleaving matrix is determined by transposing a matrix obtained after the n unit matrices are processed according to a specified algorithm, and n is determined based on the target code length M.

In an example implementation, the interleaving matrix is determined by performing double-matrix superposition on an initial interleaving matrix; or in an example implementation, the interleaving matrix is determined by performing column bit order reversing or row bit order reversing on an initial interleaving matrix.

In an example implementation, the initial interleaving matrix is determined based on n unit matrices, or the initial interleaving matrix is determined by transposing a matrix obtained after the n unit matrices are processed based on a specified algorithm, and n is determined based on the target code length M.

In an example implementation, when the unit matrix is $$F = \begin{bmatrix} 1 & 0 \\ 1 & 1 \end{bmatrix},$$

n is equal to $\log_2(N)$, and a dimension of the interleaving matrix is a minimum value of N that satisfies a formula $M \leq 3^{\log_2(N)}$; or a maximum value of N that satisfies $M \geq 3^{\log_2(N)}$ is determined as a dimension P1; a version value of $3^{\log_2(N)}$ is determined when N=P1, and a value of a remainder $M-3^{\log_2(N)}$ is determined; a value obtained after the remainder is divided by 2 is rounded to an integer, the integer is used as a new M, and a new maximum value of N that satisfies $M \geq 3^{\log_2(N)}$ is determined as a dimension P2; at least one new dimension Pi is determined in sequence based on the foregoing two steps, and calculation of Pi is stopped until the remainder is 1, 2, or 3, where a dimension Pi=Pn before the remainder is 1, 2, or 3; and a sum value of P1, P2, . . . , and Pn is determined, when the remainder is 1, the dimension of the interleaving matrix is equal to the sum value plus 1; or when the remainder is 2 or 3, 2 is added to the sum value, or the sum value is adjusted to a prime number neighboring to the sum value, where the prime number is greater than the sum value.

In an example implementation, when the unit matrix is $$F = \begin{bmatrix} 1 & 0 \\ 1 & 1 \end{bmatrix},$$

n is equal to $\log_2(N)$, and a dimension of the interleaving matrix that corresponds to M is determined in a pre-stored table of mapping between M and a dimension of the interleaving matrix.

In this embodiment of this application, the encoded bits obtained after the encoding of the polar code are interleaved by using the interleaving matrix that is determined based on the target code length M of the polar code, so that an implementation process of reading a sequence obtained after random interleaving is simple.

Figure 14:
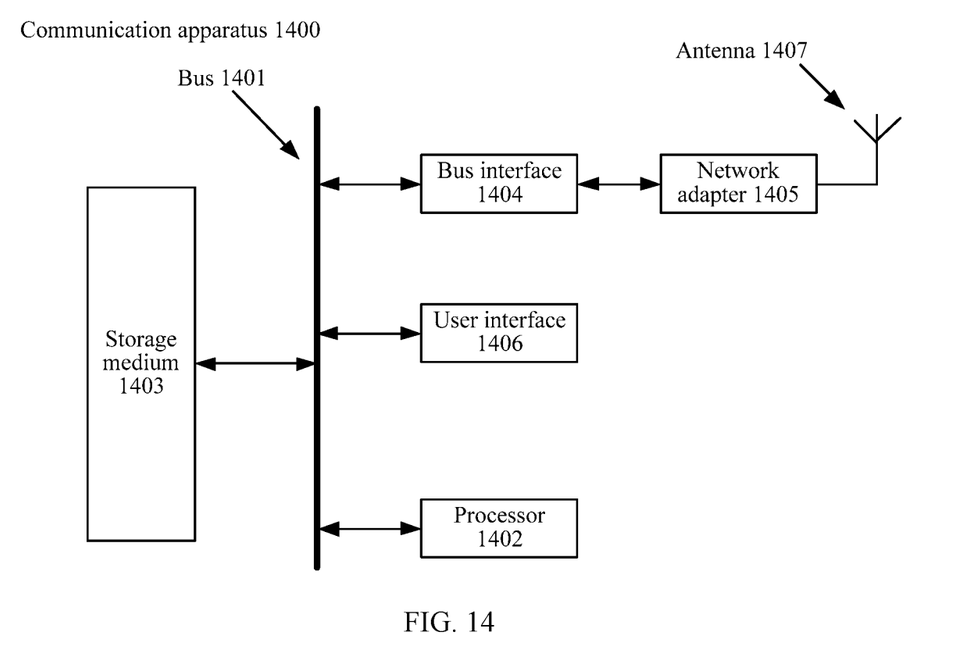
FIG. 14 is a schematic structural diagram of a communications apparatus according to an embodiment of this application.

FIG. 14 is a schematic structural diagram of a communications apparatus 1400 (for example, a communications apparatus such as an access point, a base station, a site, or a terminal device; or a chip in the foregoing communications apparatus) according to an embodiment of the present invention.

As shown in FIG. 14, the communications apparatus 1400 may be implemented by using a bus 1401 as a general bus architecture. Based on a specific application and an overall design constraint condition of the communications apparatus 1400, the bus 1401 may include any quantity of interconnected buses and bridges. The bus 1401 connects various circuits together. The circuits include a processor 1402, a storage medium 1403, and a bus interface 1404. Optionally, the communications apparatus 1400 is connected to a network adapter 1405 and the like through the bus 1401 by using the bus interface 1404. The network adapter 1405 may be configured to: implement a signal processing function of a physical layer in a wireless communications network, and send and receive a radio frequency signal by using an antenna 1407. A user interface 1406 may be connected to a user terminal, such as a keyboard, a display, a mouse, or a joystick. The bus 1401 may also connect other various circuits, such as a timing source, a peripheral device, a voltage regulator, or a power management circuit. The circuits are well-known in the art, and are not described in detail.

Alternatively, the communications apparatus 1400 may be configured as a general-purpose processing system, for example, generally referred to as a chip. The general-purpose processing system includes: one or more microprocessors providing a processor function; and an external memory providing at least a part of the storage medium 1403. All of these are connected to other support circuits by using an external bus system architecture.

Alternatively, the communications apparatus 1400 may be implemented by using the following: an ASIC (application-specific integrated circuit) including the processor 1402, the bus interface 1404, and the user interface 1406; and at least a part of the storage medium 1403 that is integrated into a single chip. Alternatively, the communications apparatus 1400 may be implemented by using the following: one or more FPGAs (field programmable gate array), a PLD (programmable logic device), a controller, a state machine, gate logic, a discrete hardware component, any another suitable circuit, or any combination of circuits that are capable of performing the functions described in the entire specification of the present invention.

The processor 1402 is responsible for bus management and general processing (including executing software stored in the storage medium 1403). The processor 1402 may be implemented by one or more general-purpose processors and/or special-purpose processors. Examples of the processor include a microprocessor, a microcontroller, a DSP processor, and another circuit that can execute the software. Software shall be construed broadly to mean instructions, data, or any combination thereof, whether referred to as software, firmware, middleware, microcode, hardware description language, or otherwise.

In the following figure, the storage medium 1403 is separated from the processor 1402. However, a person skilled in the art may easily understand that the storage medium 1403 or any part of the storage medium 1403 may be located outside the communications apparatus 1400. For example, the storage medium 1403 may include a transmission line, a carrier waveform modulated by using data, and/or a computer product separate from a wireless node. The media may be accessed by the processor 1402 by using the bus interface 1404. Alternatively, the storage medium 1403 or the any part of the storage medium 1403 may be integrated into the processor 1402. For example, the storage medium 1403 may be a cache and/or a general-purpose register.

The processor 1402 may perform the method in FIG. 1 above, and a performing process of the processor 1402 is not described herein again.

In the examples described in the embodiments of this application, units and method processes may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application.

In the several embodiments provided in this application, it should be understood that the disclosed apparatus and method may be implemented in other manners. For example, the described apparatus embodiments are merely examples. For example, the unit division is merely logical function division and may be other division in actual implementation. For example, a plurality of units or components may be combined or may be integrated into another system, or some steps may be ignored, or may not be performed. In addition, coupling, direct coupling, or a communication connection between the units may be implemented by using some interfaces, and these may be in an electronic form, a mechanical form, or another form.

The units that are described as separate components may or may not be physically separated, may be located in one place, or may be distributed to a plurality of networks units.

In addition, functional units in the embodiments of this application may be integrated into one processing unit, or each of the units may exist alone physically, or two or more units are integrated into one unit.

All or some of the foregoing embodiments may be implemented by means of software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a special-purpose computer, a computer network, or other programmable devices. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk Solid State Disk (SSD)), or the like.

What is claimed is:

1. A polar code-based interleaving method implemented by a communication device having at least one processor, the method comprising:
   determining an interleaving matrix based on n unit matrices, wherein n is determined based on a target code length M of a polar code; and
   interleaving, based on the interleaving matrix, encoded bits obtained after encoding of the polar code, to generate interleaved bits,
   wherein the n unit matrices are calculated according to a specified algorithm, and
   wherein in the interleaving matrix, a location of 1 is used to store data, and a location of 0 does not store data, discretizing burst error into a random error;
   correcting the random error; and
   improving anti-interference performance of the communication device.

2. The method according to claim 1, wherein the interleaving matrix is determined by transposing a matrix obtained after the n unit matrices are calculated according to a specified algorithm.

3. The method according to claim 1, wherein the interleaving matrix is determined by performing double-matrix superposition on an initial interleaving matrix.

4. The method according to claim 3, wherein the initial interleaving matrix is determined based on the n unit matrices or the initial interleaving matrix is determined by transposing a matrix obtained after the n unit matrices are calculated according to the specified algorithm.

5. The method according to claim 1, wherein the interleaving matrix is determined by performing at least one of column bit order reversing or row bit order reversing on an initial interleaving matrix.

6. The method according to claim 1, wherein a unit matrix is $$F = \begin{bmatrix} 1 & 0 \\ 1 & 1 \end{bmatrix},$$

n is equal to $\log_2(N)$, and a dimension of the interleaving matrix is a minimum value of N that satisfies a formula $M \leq 3^{\log_2(N)}$.

7. The method according to claim 1, wherein a unit matrix is $$F = \begin{bmatrix} 1 & 0 \\ 1 & 1 \end{bmatrix},$$

n is equal to $\log_2(N)$ and a dimension of the interleaving matrix is determined according to a formula $M \geq 3^{\log_2(N)}$.

8. The method according to claim 7, wherein the dimension of the interleaving matrix is determined according to a formula $M \geq 3^{\log_2(N)}$ comprises:
   determining a maximum value of N that satisfies $M \geq 3^{\log_2(N)}$ as a dimension P1;
   determining a version value of $3^{\log_2(N)}$ when N=P1, and determining a value of a remainder $M-3^{\log_2(N)}$;
   rounding a value obtained after dividing the remainder by 2 to an integer, using the integer as a new M, and determining a new maximum value of N that satisfies $M \geq 3^{\log_2(N)}$ as a dimension P2;
   determining at least one new dimension Pi in sequence based on the foregoing two steps, and stopping calculation of Pi until the remainder is 1, 2, or 3, wherein a dimension Pi=Pn before the remainder is 1, 2 or 3; and
   determining a sum value of P1, P2, . . . , and Pn, wherein:
   in response to the remainder being 1, the dimension of the interleaving matrix is equal to the sum value plus 1; and in response to the remainder being 2 or 3, 2 is added to the sum value or the sum value is adjusted to a prime number neighboring to the sum value, wherein the prime number is greater than the sum value.

9. The method according to claim 1, wherein a unit matrix is $$F = \begin{bmatrix} 1 & 0 \\ 1 & 1 \end{bmatrix},$$

n is equal to $\log_2(N)$, and a dimension of the interleaving matrix that corresponds to M is determined in a pre-stored table of mapping between M and a dimension of the interleaving matrix.

10. The method according to claim 1, wherein the specified algorithm is a Kronecker product or a Tracy-Singh product.

11. The method according to claim 1, wherein the interleaving matrix is defined by $G_N = F^{\otimes(\log_2(N))}$ and is determined by a Khatri-Rao product.

12. An interleaving apparatus comprising at least one processor, the interleaving apparatus configured to:
   determine an interleaving matrix based on n unit matrices, wherein n is determined based on a target code length M of a polar code; and
   interleave, based on the interleaving matrix, encoded bits obtained after encoding of the polar code, to generate interleaved bits,
   wherein the n unit matrices are calculated according to a specified algorithm, and
   wherein in the interleaving matrix, a location of 1 is used to store data, and a location of 0 does not store data,
   discretize burst error into a random error;
   correct the random error; and
   improve anti-interference performance of a communication device.

13. The apparatus according to claim 12, wherein the interleaving matrix is determined by transposing a matrix obtained after the n unit matrices are calculated according to a specified algorithm.

14. The apparatus according to claim 12, wherein the interleaving matrix is determined by performing double-matrix superposition on an initial interleaving matrix.

15. The apparatus according to claim 14, wherein the initial interleaving matrix is determined based on n unit matrices or the initial interleaving matrix is determined by transposing a matrix obtained after the n unit matrices are calculated according to the specified algorithm.

16. The apparatus according to claim 12, wherein the interleaving matrix is determined by performing column bit order reversing or row bit order reversing on an initial interleaving matrix.

17. The apparatus according to claim 12, wherein a unit matrix is $$F = \begin{bmatrix} 1 & 0 \\ 1 & 1 \end{bmatrix},$$

n is equal to $\log_2(N)$, and a dimension of the interleaving matrix is a minimum value of N that satisfies a formula $M \leq 3^{\log_2(N)}$.

18. The apparatus according to claim 12, a unit matrix is $$F = \begin{bmatrix} 1 & 0 \\ 1 & 1 \end{bmatrix},$$

n is equal to $\log_2(N)$, and a dimension of the interleaving matrix is determined according to a formula $M \geq 3^{\log_2(N)}$.

19. The apparatus according to claim 18, wherein the dimension of the interleaving matrix is determined according to a formula $M \geq 3^{\log_2(N)}$ comprises:
   determining a maximum value of N that satisfies $M \geq 3^{\log_2(N)}$ as a dimension P1;
   determining a version value of $3^{\log_2(N)}$ when N=P1, and determining a value of a remainder $M-3^{\log_2(N)}$;
   rounding a value obtained after dividing the remainder by 2 to an integer, using the integer as a new M, and determining a new maximum value of N that satisfies $M \geq 3^{\log_2(N)}$ as a dimension P2;
   determining at least one new dimension Pi in sequence based on the foregoing two steps, and stopping calculation of Pi until the remainder is 1, 2, or 3, wherein a dimension Pi=Pn before the remainder is 1, 2 or 3; and
   determining a sum value of P1, P2, . . . , and Pn, wherein:
   in response to the remainder being 1, the dimension of the interleaving matrix is equal to the sum value plus 1; and
   in response to the remainder being 2 or 3, 2 is added to the sum value or the sum value is adjusted to a prime number neighboring to the sum value, wherein the prime number is greater than the sum value.

20. A computer-readable storage medium comprising instructions, which when executed by a computer cause the computer to:
   determine an interleaving matrix based on n unit matrices, wherein n is determined based on a target code length M of a polar code; and
   interleave, based on the interleaving matrix, encoded bits obtained after encoding of the polar code, to generate interleaved bits,
   wherein the n unit matrices are calculated according to a specified algorithm, and
   wherein in the interleaving matrix, a location of 1 is used to store data, and a location of 0 does not store data,
   discretize burst error into a random error;
   correct the random error; and
   improve anti-interference performance of a communication device.

* * * * *